United States Patent [19]

Bolon et al.

[11] 3,957,694

[45] May 18, 1976

[54] RADIATION CURABLE INKS

[75] Inventors: Donald A. Bolon, Scotia; Gary M. Lucas, Schenectady, both of N.Y.

[73] Assignee: General Electric Company, Schenectady, N.Y.

[22] Filed: Sept. 27, 1974

[21] Appl. No.: 509,824

[52] U.S. Cl. .............................. 252/514; 252/501; 252/512; 106/31; 260/28.5 R
[51] Int. Cl.² .......................................... H01B 1/02
[58] Field of Search .......... 252/501, 511, 512, 514; 106/31; 260/28, 28.5 R; 204/159.16

[56] References Cited
UNITED STATES PATENTS

| | | | |
|---|---|---|---|
| 3,414,417 | 12/1968 | Miller et al. | 106/31 X |
| 3,461,092 | 8/1969 | Story | 106/31 X |
| 3,661,614 | 5/1972 | Bassemir et al. | 260/86.1 E X |
| 3,673,140 | 6/1972 | Ackerman et al. | 260/28 X |
| 3,746,662 | 7/1973 | Adelman | 252/514 X |
| 3,804,640 | 4/1974 | Buckwalter | 106/31 X |
| 3,853,727 | 12/1974 | Wrzesinski | 260/28 X |
| 3,875,094 | 4/1975 | Schroeter et al. | 260/28 |

*Primary Examiner*—Benjamin R. Padgett
*Assistant Examiner*—E. Suzanne Parr
*Attorney, Agent, or Firm*—William A. Teoli; Joseph T. Cohen; Jerome C. Squillaro

[57] ABSTRACT

A radiation curable ink is provided which is convertible to a conductive coating when cured on the surface of a substrate. When used as a printing ink, improved results are achieved if a minor amount of a blend of paraffin waxes is employed to control solvent evaporation.

8 Claims, No Drawings

RADIATION CURABLE INKS

Prior to the present invention, various curable inks were available consisting of conductive particles or flakes in a matrix or binder in the form of an organic resin or a mixture of an organic resin and volatile solvent. These curable inks are used to make conductive coatings for circuit boards and ground coatings on electrical equipment, among other things. Unlike the etching method for making circuit boards from copper-clad laminates requiring a high degree of resolution in which a negative photoresist is used in combination with a mask, the direct employment of the curable conductive ink is often more convenient and economical in particular applications.

One form of a curable ink used to make conductive coatings consists of a metal powder or flake in combination with an organic binder and an organic solvent. Cure of the ink is achieved upon evaporation of the organic solvent. Although curable inks based on solvent evaporation can be rendered conductive without heating, such inks are nevertheless unsuitable on a variety of plastic substrates. In addition, a significant amount of air pollution is created. Another available curable ink becomes conductive upon firing at an elevated temperature. It is based on the use of a conductive powder in combination with a glass as shown, for example, by J. E. Jolley, Solid State Technology, May, 1974, pp. 33–37. In order to render the ink conductive, it is necessary to fire the ink at temperatures up to 900°C. As a result, the conductive ink can only be employed on ceramic substrates which are able to withstand such extreme temperature conditions.

As shown by Ehrreich et al U.S. Pat. No. 3,202,488 and Gillard U.S. Pat. No. 3,412,043, additional conductive inks are available based on the employment of an epoxy resin which can be employed in the form of either a one-package or two-package system. A low temperature cure can be achieved with the two-package system requiring a mixing of the curing catalyst immediately prior to use, but the applied ink remains tacky for several hours. Conversely, the relatively short pot-life of the resin restricts its use to uneconomic batch type operations. Although the one-package system allows for faster cures, higher temperatures are required to release the curing catalyst.

As taught in copending application Ser. No. 509,822 of Bolon et al, filed concurrently herewith and assigned to the same assignee as the present invention, certain radiation curable organic resins, consisting of blends of aliphatically unsaturated polymers and copolymerizable monomers can be combined with certain particulated electrically conductive metal containing material, such as metal coated glass spheres or fibers, to produce a radiation curable ink which is rendered conductive upon radiation cure. Although these radiation curable inks can be used in a variety of applications, such as conductive caulks, printing inks, etc., these inks have been found particularly useful in printing applications.

As taught in Bolon et al application Ser. No. 509,893, filed concurrently herewith and assigned to the same assignee as the present invention, the above-described radiation curable inks of Bolon et al can be used to make circuit boards having conductive circuit elements printed thereon. For example, it has been found that when the radiation curable inks are screen printed onto the surface of various substrates, the periodic agitation of the curable ink from the time it is initialy flooded onto the surface of the screen, followed by the squeegeeing of the ink through the screen onto the substrate, results in the loss of volatile components from the curable ink. Although the radiation curable inks of Bolon et al utilize paraffin wax having a melting point (M.P.) of at least 135°F to 180°F to minimize oxygen inhibition of resin cure, which waxes have the side benefit of minimizing the loss of volatiles from the ink due to evaporation, by forming a protective skin on the curable ink, the constant agitation based on the initial flooding and squeegeeing continuously breaks the wax layer resulting in excess solvent evaporation. As a result, copolymerizable monomer such as styrene or acrylic monomers can be lost by evaporation. A build-up of uncured resin on the screen can result in operation break-down during continuous screen-printing.

The present invention is based on the discovery that if a blend of paraffin waxes, specifically a low melting wax such as a wax having a M.P. of about 111°F to 113°F (45°–46°C), and a higher melting wax, for example a wax having a M.P. of about 135°F (57°C) is dissolved in the organic binder component prior to mixing with the particulated electrically conductive metal containing material, a substantial reduction in evaporation of volatiles is achieved during screen printing. As a result, a more effective method for screen printing various inks having volatile components is provided. In addition, particular radiation curable inks as defined hereinafter are also provided.

There is provided by the present invention a radiation curable ink comprising by volume
  A. from about 10% to 60% of an organic resin binder having a viscosity of from 50 to 10,000 centipoises at 25°C, and
  B. from about 90% to 40% of a particulated electrically conductive metal containing material substantially free of metal containing material having an aspect ratio of diameter-to-thickness of a value greater than 20,
where there is utilized in (A) from about 0.2% to about 2.5% by weight of a blend of at least two paraffin waxes consisting essentially of waxes having a M.P. in the range of from about 135°F to about 180°F and waxes having a M.P. in the range of from about 100°F to about 135°F, where a M.P. differential of from about 15°F to 45°F is maintained between the waxes in the blend, and where the % by weight of paraffin wax having a M.P. of 135°F to 180°F can vary from about 0.1% to about 2.0% in (A).

Included by the particulated electrically conductive metal containing materials which can be used in the practice of the invention are preferably silver-coated glass spheres, of spheriods, sometimes referred to as "beads," which have a diameter of about 6 to 125 microns and preferably 10 to 50. These materials are commercially available and are made from glass spheres commonly employed as reflective filler materials. Also included are particulated metals such as iron, zinc, nickel, copper, etc., which have average diameters as previously defined and are substantially free of a non-conductive oxide coating. Procedures for making such conductive particles by plating with silver, or initially priming with copper followed by plating with silver, or noble metals, are shown by Ehrreich U.S. Pat. No. 3,202,483. Glass fibers coated with silver, copper or nickel as shown, for example, in French Patent 1,531,272 also can be used.

Particulated metals such as iron, nickel, copper, zinc, etc. in the forming of spheres, spheroids or oblong spheroids, metal or fibers also can be used which have been reduced in a hydrogen or other reducing atmosphere at elevated temperatures to effect the substantial removal of any non-conductive oxide coating to render the metal particles conductive. The particulated metal in reduced form can be shielded from oxygen prior to being treated with the organic resin binder. The resulting radiation curable ink can be stored under sealed conditions prior to use.

Some of the organic resin binders which can be used in making the photocurable inks of the present invention in combination with the above-described particulated electrically conductive metal containing material are in the form of either low molecular weight aliphatically unsaturated organic polymers, or a mixture of an aliphatically unsaturated organic polymer in further combination with a copolymerizable aliphatically unsaturated organic monomer such as styrene. The aforementioned solventless aliphatically unsaturated organic resin materials can have a viscosity of from about 50 to 10,000 centipoises at 25°C.

One variety of the solventless resins which can be employed in combination with the particulated electrically conductive metal containing material as described above in the production of the radiation curable ink of the present invention, are low molecular weight polyimides containing acrylamide unsaturation, such as shown in U.S. Pat. No. 3,535,148 — Ravve. These materials can be colorless liquids having relatively low viscosity. Another example is low molecular weight polyesters containing acrylic unsaturation shown by U.S. Pat. No. 3,567,494 — Setko. Additional examples of solventless resins are acrylate esters, or methacrylic esters of polyhydric alcohols such as shown by U.S. Pat. Nos. 3,551,246 and 3,551,235 — Bassemir. Further examples are shown by Nass U.S. Pat. No. 3,551,311. In addition, there also is included acrylate or methacrylate esters of silicone resins, acrylate or methacrylate esters, malamine, epoxy resins, allyl ethers of polyhydric alcohols, allyl esters of polyfunctional aliphatic or aromatic acids, low molecular weight maleimido substituted aromatic compounds, cinnamic esters of polyfunctional alcohols, or mixtures of such compounds, etc.

The organic resin binder which can be used in combination with the above-described particulated electrically conductive metal containing materials can be further defined as unsaturated polymers, for example, a polyester from a glycol and $\alpha,\beta$-unsaturated dicarboxylic acids, such as maleic and fumaric acids, with or without other dicarboxylic acids free of $\alpha,\beta$-unsaturation, such as phthalic, isophthalic, succinic, etc. dissolved in a copolymerizable aliphatically unsaturated organic solvent, such as styrene, vinyl toluene, divinyl benzene, methyl methacrylate, etc., or mixtures of such materials. Examples of such solventless resin compositions are shown by U.S. Pat. Nos. 2,673,151 and 3,326,710 — Brody; a further example is shown by South African Patent 694,724. Also included are unsaturated organosiloxanes having from 5 to 18 silicon atoms, which can be employed in combination with a vinylic organic monomer.

In instances where it is desired to make a radiation curable ink which is curable under ultraviolet radiation, having a wavelength of 1849 A to 4000 A, UV sensitizers can be employed when the organic resin binder is in the form of a polyester or polyacrylate or other polymerizable UV curable material. There can be employed from about 0.5 to 5% by weight of the UV sensitizer based on the weight of resin. Included among the ultraviolet radiation photosensitizers which can be used are, for example, ketones such as benzophenone, acetophenone, benzil, benzyl methyl ketone; benzoins and substituted benzoins such as benzoin methyl ether, $\alpha$-hydroxymethyl benzoin isopropyl ether; some sulfur compounds such as thiourea, aromatic disulfides, and other photosensitizers such as azides, thioketones, or mixtures thereof. There also can be used in the ink, UV stabilizers and antioxidants such as hydroquinone, tert-butyl hydroquinone, tert-butyl catechol, p-benzoquinone, 2,5-diphenylbenzoquinone, 2,6-ti-tert-butyl-p-cresol, benzotriazoles such as Tinuvin P, (manufactured by Geigy Corp.), hydroxybenzophenones such as 2,4-hydroxybenzophenone, 2-hydroxy-4-methoxybenzophenone, 4-dodecyl-2-hydroxybenzopheneone, substituted acrylonitriles such as ether-2-cyano-3,3-diphenyl acrylate, 2-ethylhexyl-2cyano-3,3-diphenyl acrylate, etc. It has been found that the conductivity of the cured ink can be impaired if chloride containing components are used which introduce more than 100 parts of chloride, per million of organic resin binder.

Additional examples of the organic resin binder which can be used in the practice of the invention are radiation curable epoxy compositions shown in copending application of James Crivello, Ser. Nos. 466,347, 466,375, and 466,378, filed May 2, 1974, assigned to the same assignee as the present invention. These Crivello compositions are one-package radiation curable epoxy resins containing aromatic onium salts of the Group VIA elements, such as sulfur, aromatic halonium salts, and Group VA elements such as arsenic which break down under the influence of radiant energy to release a Friedel-Crafts catalyst such as boron trifluoride to effect the cure of the epoxy resin.

The epoxy resins which also can be utilized as the organic resin binder to produce the photocurable inks of the present invention includes any monomeric, dimeric or oligomeric or polymeric epoxy material containing one or a plurality of epoxy functional groups. For example, epoxy resins such as the bis epoxide adduct of low molecular weight polyethylene oxide, epoxidized soybean oil, epoxidized polybutadiene or other similar resins can be used along or in combination with an epoxy containing compound as a reactive diluent. Such diluents as 4-vinylcyclohexene dioxide, limonene dioxide, 1,2-cyclohexene oxide, styrene oxide, etc., may be added as viscosity modifying agents.

In the practice of the invention, the radiation curable ink can be made by simply mixing the particulated electrically conductive metal containing material, which may be referred to hereinafter as the "conductive filler," with the organic resin binder including the wax blend, which hereinafter can be referred to collectively as the resin. In preparing the resin, the paraffin waxes, either individually, or together, can be incorporated into the organic resin binder by stirring the resin ingredients, or by warming and stirring the resulting mixture if required. In instances where the ink is printed at ambient temperatures, a low melting wax blend can be used. If printing is conducted at higher temperatures, such as 100°F, a wax blend having a higher M.P. can be used.

Depending upon such factors as the viscosity of the resin, and the particle size and nature of the conductive filler, the resulting ink can vary widely and can be a free flowing fluid or a paste. In instances where it is desired to make UV curable ink, a photosensitizer can be incorporated into the resin prior to blending with the conductive filler. There can be employed on a weight basis from about 0.5 to 10 parts of filler per part of resin.

Blending can be achieved by simply stirring the ingredients in a suitable container. In instances where the conductive filler is in the form of particulated metal which has been freshly subjected to hydrogen reduction at temperatures of 300° to 800°C to effect removal of possible oxide coating, or a chemical treatment involving the use of ammonium persulfate solutions, a special blending technique is preferably employed. The resin can be treated with a dry inert gas, such as passing the gas under the resin surface along with agitation to remove any oxygen, or moisture therefrom. Blending with the freshly reduced filler is also achieved under sealed conditions such as a dry box. The resulting radiation curable ink can be used in a standard manner to produce desirable conductive coatings, if radiated with ultraviolet light within a reasonable time after being applied to a substrate such as up to 10 minutes.

In order that those skilled in the art will be better able to practice the invention, the following examples are given by way of illustration, and not by way of limitation. All parts are by weight unless otherwise indicated.

EXAMPLE I

A polyester prepolymer was prepared by effecting reaction between about 35.3 parts of fumaric acid, 11.9 parts of dicyclopentadiene and 25.3 parts of propylene glycol. The resulting prepolymer was blended with about 24.4 parts of styrene containing 100 PPM of tert-butyl hydroquinone as a stabilizer and 1.8 parts of benzoinsec-butylether.

A series of wax containing resins were prepared from the above mixture of ingredients. There was employed a wax having a M.P. of 135°F (57.3°C). There was used 0% wax, 0.35% wax, and 0.70% wax. In some instances, the wax was incorporated by stirring and in other instances, stirring and warming the resin to 58°C was used to achieve solution.

The above wax containing resins were then combined with silver coated glass spheres having an average diameter of about 10–50 microns to produce a series of printing inks. On a volume basis, there was used about 2 volumes of glass spheres per volume of resin.

A static evaporation study was made with the above prepared printing inks. A total of 5 inks were evaluated to determine the effect if any, the presence of wax had on the % weight loss of volatiles under static conditions at ambient temperatures. Equal portions of inks were poured onto a glass plate and the change in total weight of resin in the ink and plate based on evaporation of volatiles over a 30 minute period was determined. Ink I was free of wax; Ink II contained .35% wax which had not completely dissolved; Ink III had .35% wax which had been completely dissolved; Ink IV had 0.70% wax which had not completely dissolved; and Ink V had 0.70% wax completely dissolved. The determination as to whether the wax had dissolved or not was made with the resin prior to the incorporation of the silver-coated glass spheres. In one case, the wax was merely stirred into the resin, while in the instance where the wax was completely dissolved, stirring and warming the resin to 58°C. was used.

Based on the results, Ink I which was free of wax suffered a loss of 2.3% weight within one minute at ambient temperature. Ink II experienced a weight loss of about 2% in 30 minutes; Ink III and IV had a weight loss of about 0.5%, while ink V suffered only a 0.1% weight loss.

Another series of printing inks were made following the same procedure as above, except other waxes were used in addition to the 135°F M.P. wax. Ink VI had 1% by weight of a wax having a M.P. of 111°–113°F; ink VII had a blend of 0.35% of a 155°F M.P. wax and 0.35% 135°F M.P. wax; Ink VIII had a .35% 135°F M.P. wax; Ink IX had 1% of a 135°F wax and Ink X had a blend of 35% 111°–113°F M.P. wax and .35% 135°F M.P. wax. The waxes were incorporated into the resin by stirring and warming prior to blending with the silver coated glass spheres. An evaporation study was made at ambient temperatures. A sufficient amount of each of the printing inks was poured into a petri dish and agitated with a paddle to simulate the action of a screen printer. The results are shown in the following Table which shows the result obtained after 30 minutes of stirring at ambient conditions where WT% is the weight of wax used based on the weight of resin, while % WT loss is weight loss of volatiles based on the weight of resin.

| Wax | WT % | % WT Loss |
|---|---|---|
| 155°F + 135°F | .35 each | .95 |
| 135°F | .35 | .8 |
| 135°F | 1% | .52 |
| 111°F | 1% | 1.47 |
| 111°F + 135°F | .35 each | .4 |

The above results establish that the use of a blend is superior to the use of individual waxes. There is also shown the advantage achieved of using a blend of lower M.P. waxes when agitation is effected at ambient temperatures. For example, if stirring was effected at 100°C, the blend of 155°F + 135°F would be appropriate.

EXAMPLE II

A screen printable ink is made in accordance with the procedure of Example I containing 0.7% by weight of a blend of equal parts of 111°–113°F M.P. wax and a 135°F M.P. The wax is incorporated into a composition consisting of about two parts of the silver coated glass beads of Example I with one part of an organic resin binder consisting of 70 parts of the acrylated epoxidized soy bean oil and 30 parts of ethyl hexyl and acrylate with two parts of the photosensitizer of Example I. The wax was incorporated into the resin prior to the incorporation of the silver coated glass beads by stirring and warming the was resin mixture. Prior to mixing, the volume of the conductive filler was approximately two times of the volume of the organic resin binder.

The above photocurable ink is continuously screen printed onto two 2 inches by 6 inches polystyrene substrates, in accordance with the procedure shown in copending application RD-7713, Bolon, et al, filed concurrently herewith and assigned to the same assignee as a present invention. The photocurable ink is flooded onto the surface of the screen printer followed by squeegeeing the ink with a blade to remove excess ink and to transfer the ink through the screen onto the surface of the polystyrene substrate. It is found that after the silk screening of 2,000 polystyrene substrates in a period of 6 hours that substantially no ink buildup is found on the surface of the silk screen. This allows the continuous use of the silk screen over a period of 6 or more hours before the surface of the printer has to be cleaned to remove excess resin from the pattern area.

The above procedure is repeated except that in place of the blend of wax, there is used an equal % by weight of wax having a M.P. of 135°F. The wax is incorporated into the resin in the same manner as the blend is incorporated as described above. It is found that following the same silk screening procedure that the surface of the silk screen has to be cleaned after 1 to 1.5 hours of continuous operation due to the buildup of ink around the pattern area which interferes with the transfer of the ink through the screen causing a distortion of the ink pattern on the polystyrene substrate.

The above results show that the use of the wax blend provides more continuous operation of the silk screen over an extended period of time using the wax blend as compared to the same weight % of wax having a M.P. of 135°F.

EXAMPLE III

A printing ink is prepared in accordance with the procedure of Example I employing one part of an epoxy resin binder per two parts of the silver coated glass spheres. The epoxy resin binder consists of about 15 parts of styrene oxide and 85 parts of (3,4 epoxycyclohexyl)-methyl-3.4-epoxycyclohexanecarboxylate.
In addition, there is also used 2 parts of triphenylsulfoniumhexafluoro arsenate as a photosensitizer.

There is incorporated into the above resin binder 1% by weight of a blend of a paraffin wax having a 111°–113°F M.P. and 0.7% of a paraffin wax having a 135°F M.P. It is found that when the blend is stirred and warmed into the resin at a temperature of 58°C, a solution is obtained. A printing ink is prepared by mixing 1 part of the wax containing resin per 2 parts of the silver coated glass spheres of Example I. A portion of the ink is poured into a petri dish and stirred vigorously in the same manner as Example I at ambient temperatures. It is found that comparable evaporation control is obtained as exhibited by the ink of Example I containing 0.7% by weight of the equal part blend of paraffin waxes having a 111°–113°F M.P. and a 135°F M.P. This result is established by weighing the petri dish initially with the resin and then weighing it periodically over the course of 30 minutes to determine the weight loss of resin.

The above curable ink is also used to make screen printed circuit boards of polystyrene substrates in accordance with the procedures in Example II. It is found that substantially little ink build up is noted on the surface of the screen after about 6 hours of continuous hours of operation.

As described in the above-mentioned co-pending application of Bolon, et al, Ser. No. 509,822, a surprising feature of the radiation curable ink of the present invention is that the shape of the particulated conductive material largely determines whether the radiation curable ink will cure satisfactorily to the conductive state. For example, unsatisfactory cures result, if the particulated electrically conductive metal containing material is in the form of flakes. Flakes are defined within the meaning of the present invention as being an electrically conductive metal containing material which have an aspect ratio D/T of greater than 20, where "D" is the diameter of the flake and "T" is the thickness. Experience has shown that the particulated electrically conductive metal containing material employed in the practice of the invention is preferably spherical, spheroidal or oblong spheroidal in shape. Although less desirable than spheres, metal fibers, or glass fibers coated with metal have been found to be more effective than metal flakes, with respect to allowing satisfactory cures of the photocurable ink when it is subjected to radiation cure. It has been found however, that up to about 15% by weight of flakes based on the weight of particulated electrically conductive metal containing material can be tolerated in the ink without adverse results.

Although the above examples are limited to only a few of the very many curable inks which can be made in accordance with the present invention, it should be understood that the printing inks of the present invention can consist of the wide variety of organic resin binders, as well as the various particulated electrically conductive fillers discussed in the description preceding these examples. In addition, electron beam cure also can be used to effect the cure of the subject curable inks, if desired.

What we claim as new and desire to secure by letters patent of the United States is:

1. A radiation curable ink comprising by volume
   A. from about 10% to 60% of an organic resin binder having a viscosity of from 50 to 10,000 centipoises at 25°C, and
   B. from about 90% to 40% of a particulated electrically conductive metal containing material substantially free of metal containing material having an aspect ratio of diameter-to-thickness of a value greater than 20 where there is utilized in (A) from about 0.2% to about 2.5% by weight of a blend of at least two paraffin waxes consisting of waxes having a M.P. in the range of from about 135°F to about 180°F and waxes having a M.P. in the range of from 100°F to about 135°F, where a M.P. differential of from about 15°F to 45°F is maintained between the waxes in the blend, and where the percent by weight of paraffin wax having a M.P. of 135°F to 180°F can vary from about 0.1% to about 2.0% in (A).

2. A curable ink in accordance with claim 1, where the particulated electrically conductive metal containing material is silver coated glass spheres.

3. A curable ink in accordance with claim 1, where the organic resin binder is a blend of an unsaturated polyester and styrene.

4. A curable ink in accordance with claim 1, where the curable ink is an epoxy resin.

5. A curable ink in accordance with claim 1, where the organic resin binder is in the form of a polyacrylate.

6. A curable ink in accordance with claim 1, where the waxes are present in the blend at about equal parts by weight.

7. A curable ink in accordance with claim 5, where the wax blend is present at about 0.7% by weight based on the organic resin.

8. In a method for transferring a printing ink onto a substrate at a temperature of up to 60°C which comprises the steps
   1. applying the printing ink onto a patterned surface and 2. transferring the ink from the patterned surface onto the surface of the substrate where there is a tendency of printing ink residues to buildup on the surface of the pattern as a result of the evaporation of volatile components in the printing ink, the improvement which comprises using a printing ink having by weight from about 0.2% to about 2.5% of a blend of paraffin waxes based on the weight of the volatile components of the printing ink, where the wax blend consists of at least 2 waxes having a melting point differential of from 15°–45°F where at least one of the waxes has an M.P. of from 100°F to about 135°F and another wax has an M.P. of about 135°F to about 180°F, and where the percent by weight of paraffin wax having a M.P. of 135°F to 180°F can vary from about 0.1% to about 2.0%.

* * * * *